(12) United States Patent
Hwang et al.

(10) Patent No.: US 11,158,356 B1
(45) Date of Patent: Oct. 26, 2021

(54) CALIBRATION CIRCUIT AND OPERATING METHOD OF THE CALIBRATION CIRCUIT

(71) Applicant: SK hynix Inc., Icheon-si (KR)

(72) Inventors: Jin Ha Hwang, Icheon-si (KR); Kwan Su Shon, Icheon-si (KR); Keun Seon Ahn, Icheon-si (KR); Yo Han Jeong, Icheon-si (KR); Eun Ji Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/097,948

(22) Filed: Nov. 13, 2020

(30) Foreign Application Priority Data

May 27, 2020 (KR) .......................... 10-2020-0063738

(51) Int. Cl.
*G11C 5/14* (2006.01)
*G11C 7/10* (2006.01)

(52) U.S. Cl.
CPC .............. *G11C 5/147* (2013.01); *G11C 7/109* (2013.01); *G11C 7/1063* (2013.01); *G11C 7/1069* (2013.01); *G11C 7/1096* (2013.01); *G11C 2207/2254* (2013.01)

(58) Field of Classification Search
CPC ..... G11C 5/147; G11C 7/1063; G11C 7/1069; G11C 7/109; G11C 7/1096
See application file for complete search history.

(56) References Cited

U.S. PATENT DOCUMENTS

| 2009/0002018 | A1* | 1/2009 | Jeong | ................. H04L 25/028 326/30 |
| 2011/0128038 | A1* | 6/2011 | Ko | ...................... G11C 7/04 326/30 |

FOREIGN PATENT DOCUMENTS

| KR | 100866928 B1 | 11/2008 |
| KR | 1020170127169 A | 11/2017 |

* cited by examiner

*Primary Examiner* — Han Yang
(74) *Attorney, Agent, or Firm* — William Park & Associates Ltd.

(57) ABSTRACT

Provided is a calibration circuit and operating method of the calibration circuit. A calibration circuit includes a first resistor code output circuit and a second resistor code output circuit. The first resistor code output circuit is coupled to an external resistor through an input/output pad, performs a first calibration operation, based on a first resistor value, such that a target voltage applied to a first reference node coupled to the input/output pad has a set voltage level, and outputs a first resistor code as a result obtained by performing the first calibration operation. The second resistor code output circuit receives the target voltage, sets an internal resistor value, based on the first resistor code, performs a second calibration operation, based on a second resistor value different from the first resistor value, and outputs a second resistor code as a result obtained by performing the second calibration operation. The first resistor value is a resistor value of the first resistor.

20 Claims, 8 Drawing Sheets

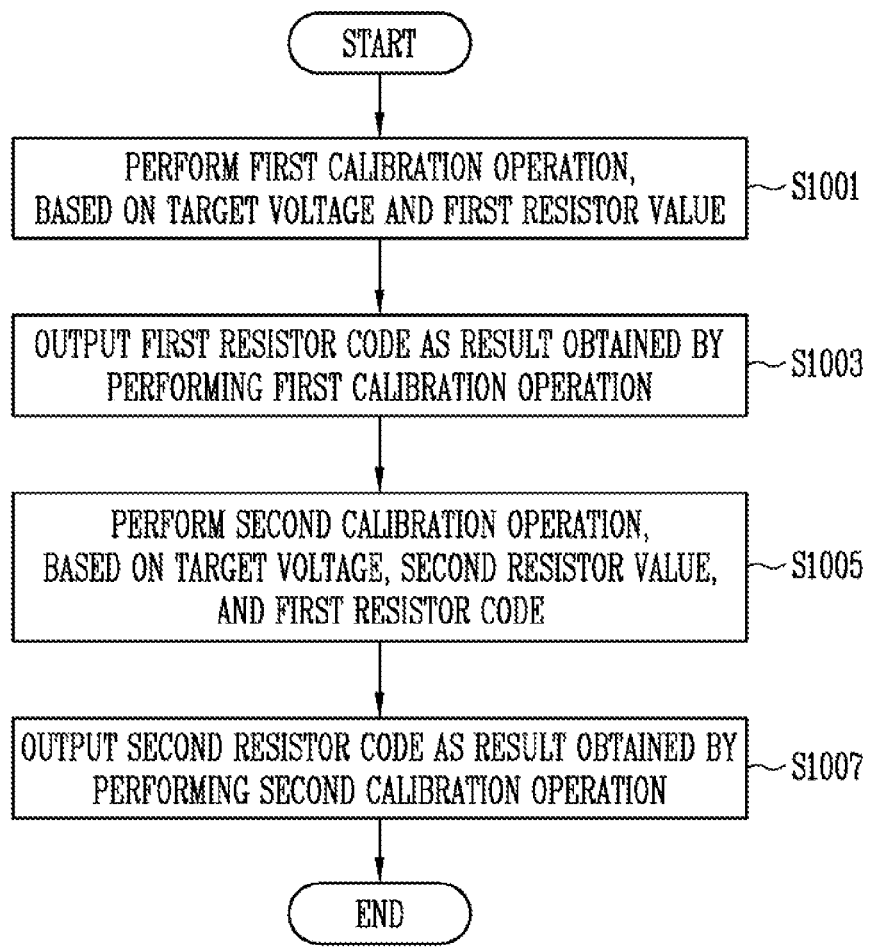

CALIBRATION CIRCUIT AND OPERATING METHOD OF THE CALIBRATION CIRCUIT

CROSS-REFERENCE TO RELATED APPLICATION

The present application claims priority under 35 U.S.C. § 119(a) to Korean patent application number 10-2020-0063738, filed on May 27, 2020, in the Korean Intellectual Property Office, the entire disclosure of which is incorporated herein by reference.

BACKGROUND

1. Technical Field

The present disclosure generally relates to an electronic device, and more particularly, to a calibration circuit and an operating method of the calibration circuit.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data is lost when the supply of power is interrupted. The volatile memory device may include a Static Random Access Memory (SRAM), a Dynamic Random Access Memory (DRAM), and the like.

The nonvolatile memory device is a memory device in which data is not lost even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a calibration circuit of which may include: a first resistor code output circuit coupled to a first resistor through an input and output (input/output) pad and a second resistor code output circuit. The first resistor code output circuit may perform a first calibration operation, based on a first resistor value, such that a target voltage applied to a first reference node coupled to the input/output pad has a set voltage level, outputs a first resistor code as a result obtained by performing the first calibration operation. The second resistor code output circuit may receive the target voltage, set an internal resistor value based on the first resistor code, perform a second calibration operation based on a second resistor value different from the first resistor value, and output a second resistor code as a result obtained by performing the second calibration operation. The first resistor value is a resistor value of the first resistor.

In accordance with another aspect of the present disclosure, there may be provided a method for operating a calibration circuit coupled to a first resistor through an input and output (input/output) pad, the method may include: performing a first calibration operation, based on a first resistor value, such that a target voltage applied to a first reference node coupled to the input/output pad has a set voltage level; outputting a first resistor code as a result obtained by performing the first calibration operation; performing a second calibration operation, based on the target voltage, a second resistor value different from the first resistor value, and the first resistor code; and outputting a second resistor code as a result obtained by performing the second calibration operation. The first resistor value is a resistor value of the first resistor.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 10 is a flowchart illustrating an operation of the calibration circuit in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments may provide a calibration circuit having improved calibration performance and an operating method of the calibration circuit.

Figure 1:
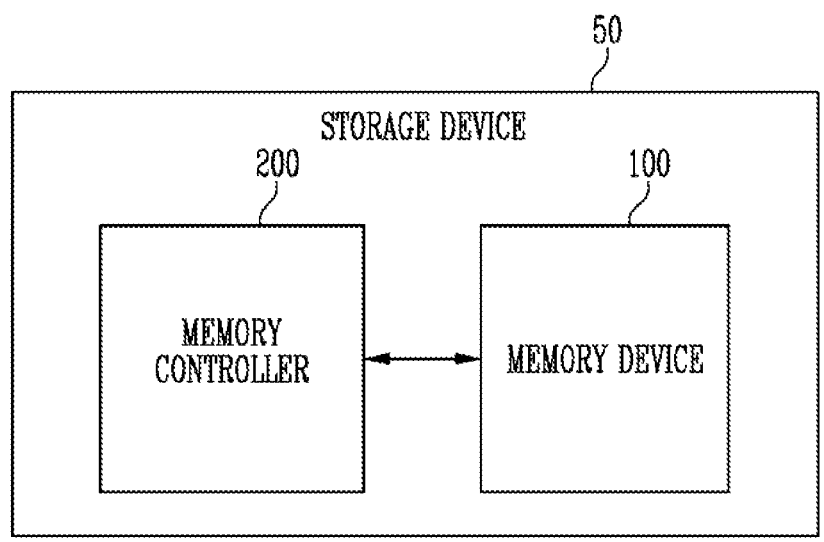
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme so as to improve operational performance. The interleaving scheme may be an operating scheme that allows operating sections of at least two memory devices 100 to overlap with each other.

The host may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
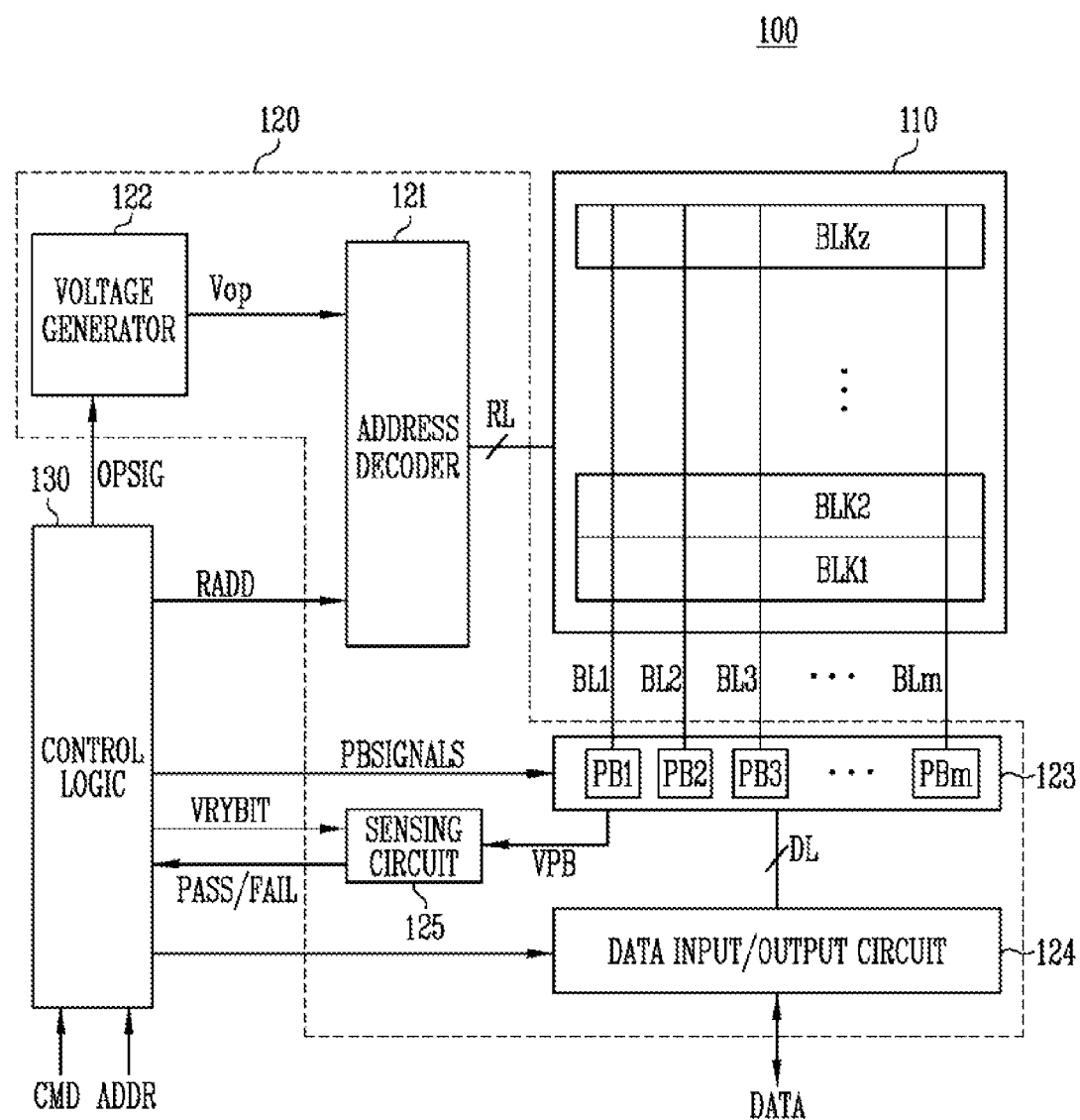
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a selected memory block according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected pages are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

Figure 3:
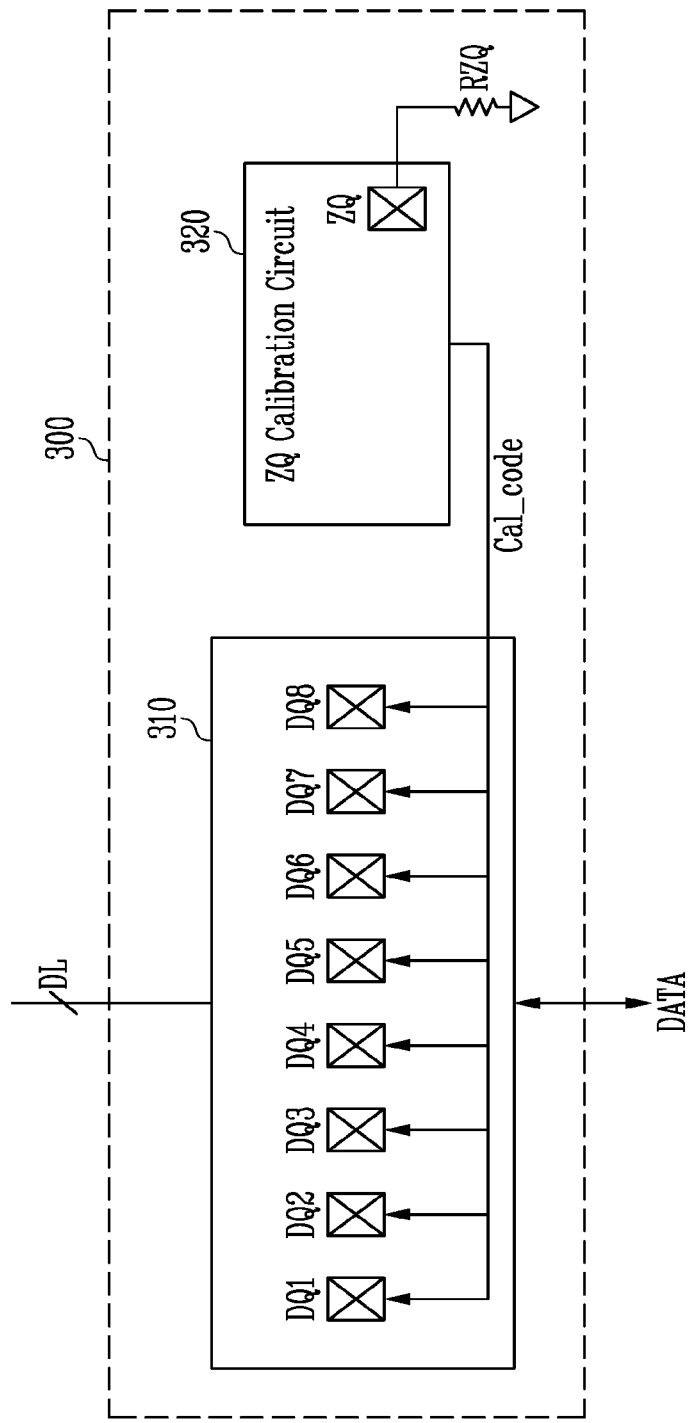
FIG. 3 is a diagram illustrating another embodiment of a data input/output circuit shown in FIG. 2.

FIG. 3 is a diagram illustrating another embodiment of the data input/output circuit shown in FIG. 2.

Referring to FIG. 3, the data input/output circuit 300 may include a data input/output pad group 310 and a calibration circuit 320 (i.e., ZQ Calibration Circuit).

The data input/output pad group 310 may include a plurality of DQ pads DQ1 to DQ8. Each DQ pad may receive data from the outside through an input/output line, and transfer the received data to the read/write circuit through a data line DL. A resistor value coupled to each DQ pad may be controlled based on a resistor code Cal_code received from the calibration circuit 320.

The calibration circuit 320 may be coupled to an external resistor RZQ through a input/output pad ZQ. The calibration circuit 320 may perform a first calibration operation on an external resistor RZQ value. The calibration circuit 320 may generate a first resistor code as a result obtained by performing the first calibration operation. The calibration circuit 320 may set resistor values of a pull-up resistor and a pull-down resistor in the calibration circuit 320, based on the first resistor code. Subsequently, the calibration circuit 320 may perform a second calibration operation on an internal resistor value used in the DQ pad. The calibration circuit 320 may generate a second resistor code as a result obtained by performing the second calibration operation. The calibration circuit 320 may output the second resistor code to the data input/output pad group 310. The second resistor code may be the resistor code Cal_code.

Figure 4:
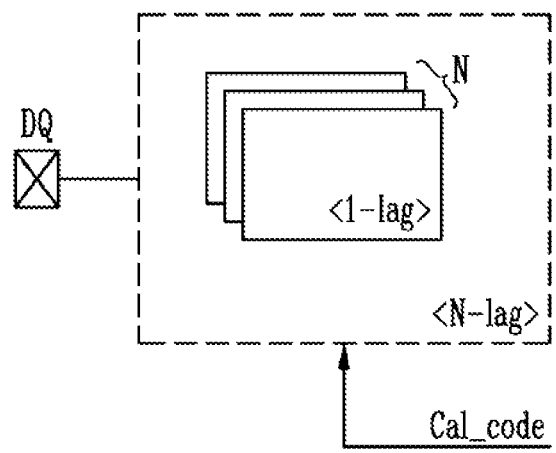
FIG. 4 is a diagram illustrating a resistor coupled to a data input and output (DQ) pad.

FIG. 4 is a diagram illustrating a resistor coupled to the data input and output (DQ) pad In an embodiment, the resistor coupled to the DQ pad may include one or more lag resistors (i.e., N-lag includes N number of 1-lag connected in parallel with each other).

Referring to FIG. 4, N (N is a natural number of 1 or more) lag resistors may be coupled in parallel to the DQ pad. In an embodiment, a lag resistor may be a pull-up resistor. In another embodiment, a lag resistor may be a pull-down resistor. A resistor value of each lag resistor may be determined based on a resistor code Cal_code.

In an embodiment, when one lag resistor has a resistor value of 300 ohms, six lag resistors are required such that the resistor value coupled to the DQ pad is set to 50 ohms. When one lag resistor has a resistor value of 150 ohms, three lag resistors are required such the resistor value coupled to the DQ pad is set to 50 ohms.

That is, when the resistor value coupled to the DQ pad is set smaller than that of one lag resistor, a smaller number of lag resistors is required as each lag resistor's resistor value becomes smaller, which is more advantageous in decreasing a circuit size.

Figure 5:
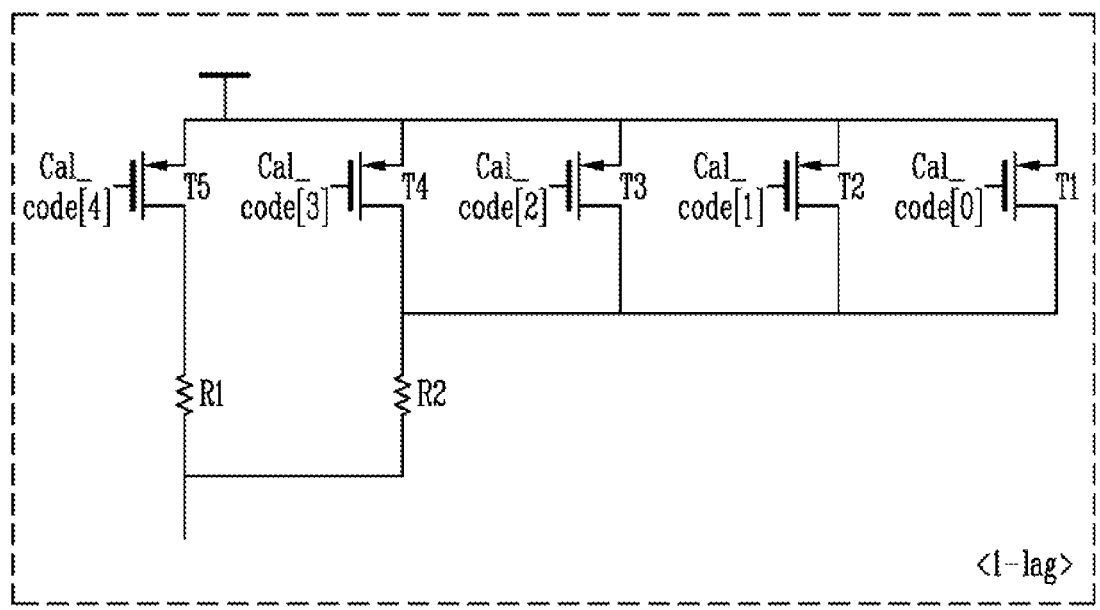
FIG. 5 is a diagram illustrating a pull-up resistor in accordance with an embodiment of the present disclosure.

FIG. 5 is a diagram illustrating a pull-up resistor in accordance with an embodiment of the present disclosure.

Referring to FIGS. 4 and 5, a lag resistor as a pull-up resistor is illustrated.

In FIG. 5, the pull-up resistor may include a plurality of transistors T1 to T5. The number of transistors is not limited to this embodiment. In an embodiment, the transistors may be implemented with a PMOS transistor. In another embodiment, the transistors may be implemented with an NMOS transistor.

First to fourth transistors T1 to T4 may be coupled in parallel between a power voltage node and a second resistor R2. A fifth transistor T5 may be coupled between the power voltage node and a first resistor R1. The first resistor R1 and the second resistor R2 may be coupled to each other. In an embodiment, the first to fifth transistors T1 to T5 may be the same. In an embodiment, the first to fifth transistors T1 to T5 may be different from one another. In an embodiment, some of the first to fifth transistors T1 to T5 may be the same, and the others of the first to fifth transistors T1 to T5 may be different from each other.

Each transistor may be turned on or turned off according to a resistor code Cal_code[4:0]. A resistor value of the pull-down resistor may be determined based on the transistor turned on or turned off according to the resistor code Cal_code[4:0].

Figure 6:
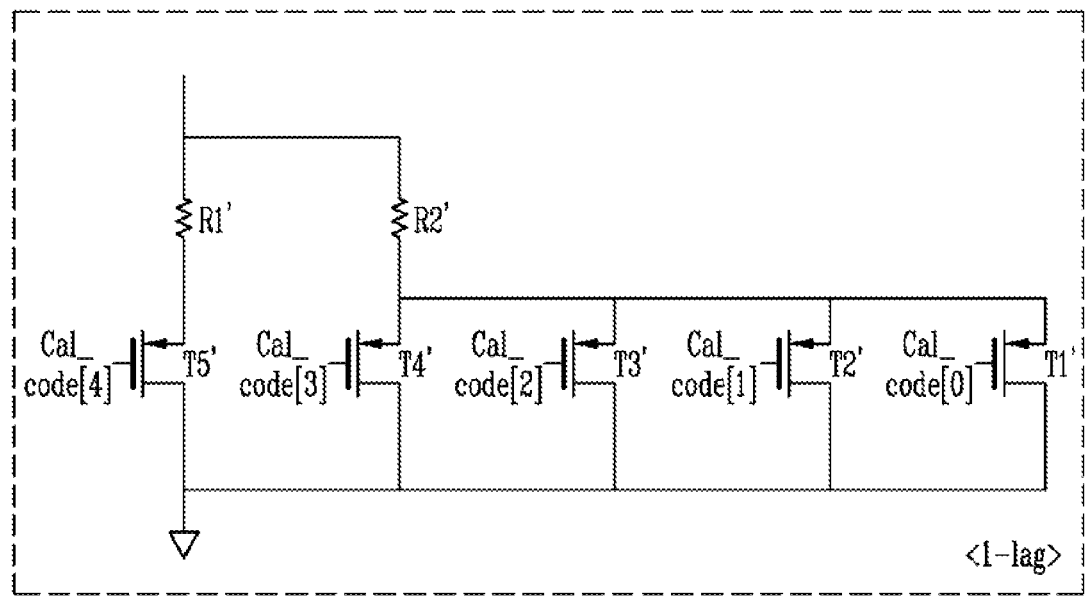
FIG. 6 is a diagram illustrating a pull-down resistor in accordance with an embodiment of the present disclosure.

FIG. 6 is a diagram illustrating a pull-down resistor in accordance with an embodiment of the present disclosure.

Referring to FIGS. 4 and 6, a lag resistor as a pull-down resistor is illustrated.

In FIG. 6, the pull-down resistor may include a plurality of transistors T1' to T5'. The number of transistors is not limited to this embodiment. In an embodiment, the transistors may be implemented with a PMOS transistor. In another embodiment, the transistors may be implemented with an NMOS transistor.

First to fourth transistors T1' to T4' may be coupled in parallel between a ground voltage node and a second resistor R2'. A fifth transistor T5' may be coupled between the ground voltage node and a first resistor R1'. The first resistor R1' and the second resistor R2' may be coupled to each other. In an embodiment, the first to fifth transistors T1' to T5' may be the same. In an embodiment, the first to fifth transistors T1' to T5' may be different from one another. In an embodiment, some of the first to fifth transistors T1' to T5' may be the same, and the others of the first to fifth transistors T1' to T5' may be different from each other.

Each transistor may be turned on or turned off according to a resistor code Cal_code[4:0]. A resistor value of the pull-down resistor may be determined based on the transistor turned on or turned off according to the resistor code Cal_code[4:0].

Figure 7:
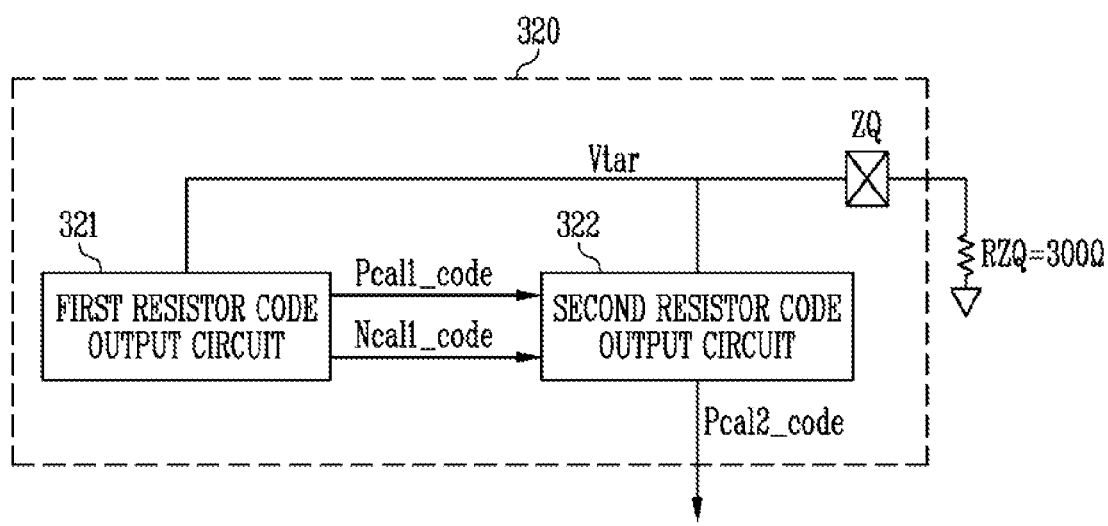
FIG. 7 is a diagram illustrating a calibration circuit shown in FIG. 3.

FIG. 7 is a diagram illustrating the calibration circuit shown in FIG. 3.

Referring to FIG. 7, the calibration circuit 320 may include a first resistor code output circuit 321 and a second resistor code output circuit 322.

The first resistor code output circuit 321 may be coupled to an external resistor RZQ through an input/output pad ZQ. The external resistor RZQ may have, for example but not limited to, a resistor value of 300 ohms. The resistor value of the external resistor RZQ is not limited to this embodiment.

The first resistor code output circuit 321 may perform a first calibration operation, based on a first resistor value, such that a target voltage Vtar applied to a first reference node has a set voltage level. In an embodiment, the first resistor value may be the resistor value of the external resistor RZQ. The first resistor code output circuit 321 may output, to the second resistor code output circuit 322, a first resistor code as a result obtained by performing the first calibration operation. The first resistor code may include a first pull-up resistor code Pcal1_code and a first pull-down resistor code Ncal1_code.

The second resistor code output circuit 322 may set a resistor value of an internal pull-up resistor, based on the first pull-up resistor code Pcal1_code. The second resistor code output circuit 322 may set a resistor value of an internal pull-down resistor, based on the first pull-down resistor code Ncal1_code. The second resistor code output circuit 322 may receive the target voltage Vtar, and perform a second calibration operation, based on a second resistor value. The second resistor value may be different from the first resistor value. The second resistor value may be set as a resistor value obtained by dividing the first resistor value by an integer multiple. The first resistor value may be a resistor value of an external resistor. In an embodiment, the first resistor value may be an integer multiple of the second resistor value. In an embodiment, the second resistor value may be a resistor value of one lag resistor coupled to the DQ pad described with reference to FIG. 4. The second resistor code output circuit 322 may output, to the outside, the second resistor code as a result obtained by performing the second calibration operation. The second resistor code may include a second pull-up resistor code Pcal2_code.

Figure 8:
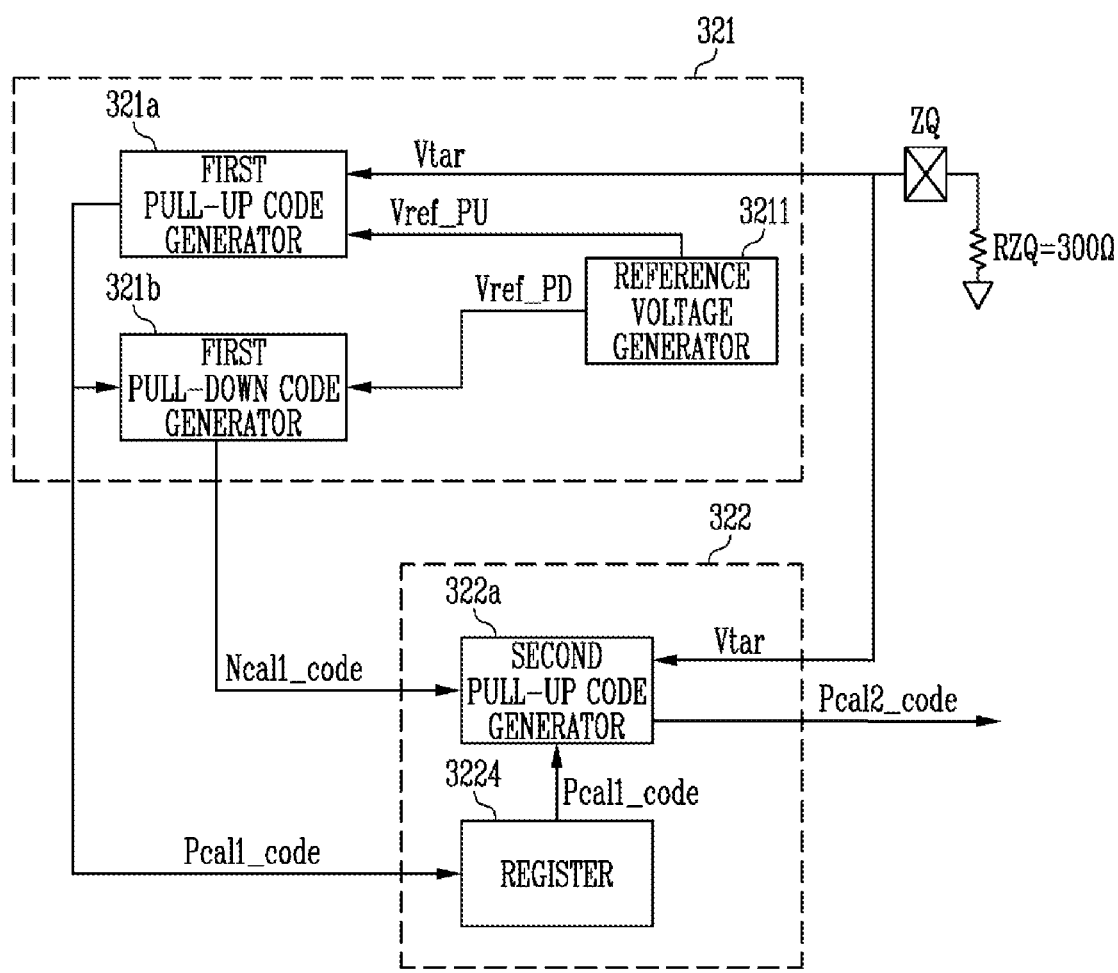
FIG. 8 is a diagram illustrating a configuration and an operation of the calibration circuit shown in FIG. 7.

FIG. 8 is a diagram illustrating a configuration and an operation of the calibration circuit shown in FIG. 7.

Referring to FIG. 8, the first resistor code output circuit 321 may include a reference voltage generator 3211, a first pull-up code generator 321a, and a first pull-down code generator 321b.

The reference voltage generator 3211 may generate a pull-up reference voltage Vref_PU and a pull-down reference voltage Vref_PD.

The first pull-up code generator 321a may receive a target voltage Vtar through the input/output pad ZQ. The first pull-up code generator 321a may receive the pull-up reference voltage Vref_PU from the reference voltage generator 3211. The first pull-up code generator 321a may generate a first pull-up resistor code Pcal1_code, based on a result obtained by comparing the target voltage Vtar and the pull-up reference voltage Vref_PU.

The first pull-down code generator 321b may receive the first pull-up resistor code Pcal1_code from the first pull-up code generator 321a. The first pull-down code generator 321b may receive the pull-down reference voltage Vref_PD from the reference voltage generator 3211. The first pull-down code generator 321b may generate a first pull-down resistor code Ncal1_code, based on the first pull-up resistor code Pcal1_code and the pull-down reference voltage Vref_PD.

The second resistor code output circuit 322 may include a register 3224 and a second pull-up code generator 322a.

The register 3224 may store the first pull-up resistor code Pcal1_code received from the first resistor code output circuit 321.

The second pull-up code generator 322a may receive the first pull-down resistor code Ncal1_code from the first resistor code output circuit 321. The second pull-up code generator 322a may set a resistor value of a pull-down resistor in the second pull-up code generator 322a, based on the first pull-down resistor code Ncal1_code.

The second pull-up code generator 322a may receive the first pull-up resistor code Pcal1_code from the register 3224. The second pull-up code generator 322a may set a resistor value of a pull-up resistor in the second pull-up code generator 322a, based on the first pull-up resistor code Pcal1_code.

The second pull-up code generator 322a may receive the target voltage Vtar through the input/output pad ZQ. The second pull-up code generator 322a may generate a second pull-up resistor code Pcal2_code, based on a result obtained by comparing a voltage applied between the internal pull-up resistor and the internal pull-down resistor with the target voltage Vtar.

Figure 9:
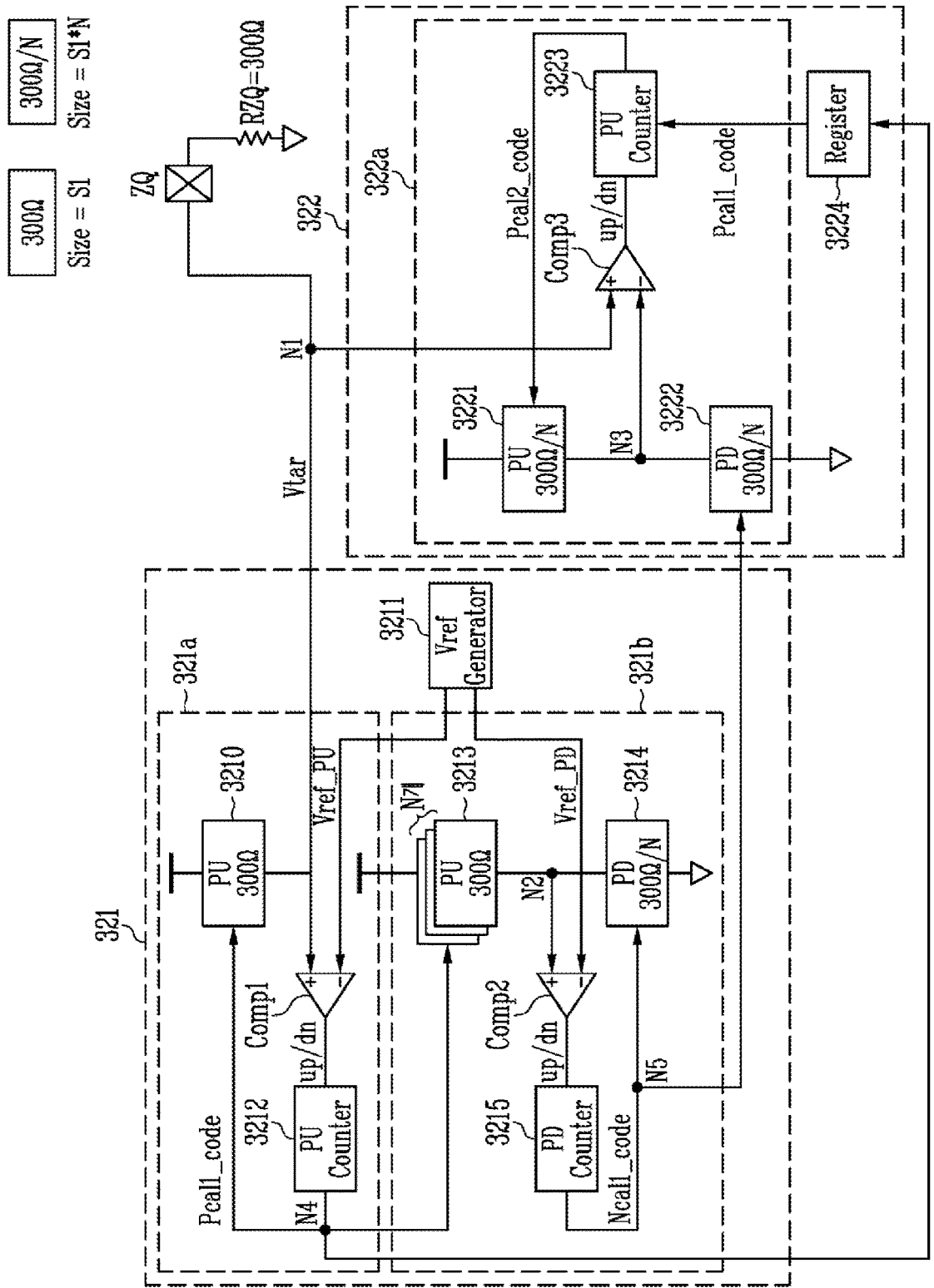
FIG. 9 is a diagram illustrating a configuration and an operation of the calibration circuit shown in FIG. 8.

FIG. 9 is a diagram illustrating a configuration and an operation of the calibration circuit shown in FIG. 8.

Referring to FIG. 9, the first resistor code output circuit 321 may include a reference voltage generator 3211, a first pull-up code generator 321a, and a first pull-down code generator 321b.

The first pull-up code generator 321a may include a first pull-up resistor 3210, a first comparator Comp1, and a pull-up counter 3212.

The first pull-up resistor 3210 may be coupled between a power voltage node and a first reference node N1, and have a resistor value controlled according to a first pull-up resistor code Pcal1_code. A target voltage Vtar applied to the first reference node N1 may be a voltage obtained by dividing the power voltage according to the resistor value of the first pull-up resistor 3210 and a resistor value of the external resistor RZQ. In an embodiment, the resistor value of the first pull-up resistor 3210 and the resistor value of the external resistor RZQ are the same, and therefore, the target voltage Vtar may be set to ½ of the power voltage. However, the level of the target voltage Vtar is not limited to this embodiment. The resistor value of the first pull-up resistor 3210 may be determined as a first resistor value. The first resistor value may be a resistor value of the external resistor RZQ coupled through the input/output pad ZQ.

The first comparator Comp1 may generate a first up or down (up/dn) signal, based on a result obtained by comparing the target voltage Vtar and the pull-up reference voltage Vref_PU. For example, when the target voltage Vtar is lower than the pull-up reference voltage Vref_PU, the first comparator Comp1 may generate a down signal for decreasing the resistor value of a resistor. When the target voltage Vtar is higher than the pull-up reference voltage Vref_PU, the first comparator Comp1 may generate an up signal for increasing the resistor value of the resistor.

The pull-up counter 3212 may output a first pull-up resistor code Pcal1_code in response to the first up/down signal. When the pull-up counter 3212 receives the up signal, the pull-up counter 3212 may increase the value of the first pull-up resistor code Pcal1_code. When the pull-up counter 3212 receives the down signal, the pull-up counter 3212 may decrease the value of the first pull-up resistor code Pcal1_code. In another embodiment, when the pull-up counter 3212 receives the up signal, the pull-up counter 3212 may decrease the value of the first pull-up resistor code Pcal1_code. When the pull-up counter 3212 receives the down signal, the pull-up counter 3212 may increase the value of the first pull-up resistor code Pcal1_code.

The first pull-down code generator 321b may include a plurality of second pull-up resistors 3213, a first pull-down resistor 3214, a second comparator Comp2, and a pull-down counter 3215.

The plurality of second pull-up resistors 3213 may be coupled between the power voltage node and a second reference node N2, and have a resistor value controlled according to the first pull-up resistor code Pcal1_code. In an embodiment, a resistor value of each of the plurality of second pull-up resistors 3213 may be determined based on a first resistor value. The first resistor value may be a resistor value of the external resistor RZQ coupled through the input/output pad ZQ. The plurality of second pull-up resistors 3213 may be coupled in parallel.

The first pull-down resistor 3214 may be coupled between the second reference node N2 and a ground voltage node, and have a resistor value controlled according to a first pull-down resistor code Ncal1_code. In an embodiment, a resistor value of the first pull-down resistor 3214 may be determined based on a second resistor value. The second resistor value may be a value obtained by dividing the first resistor value by an integer multiple. The second resistor value may be a resistor value of one lag resistor coupled to the DQ pad described with reference to FIG. 4.

The second comparator Comp2 may generate a second up/down signal, based on a result obtained by comparing a voltage applied to the second reference node N2 and the pull-down reference voltage Vref_PD. The voltage applied to the second reference node N2 may be a voltage obtained by dividing the power voltage according to the resistor value of the plurality of second pull-up resistors 3213 and the resistor value of the first pull-down resistor 3214.

For example, when the voltage applied to the second reference node N2 is lower than the pull-down reference voltage Vref_PD, the second comparator Comp2 may generate an up signal for increasing the resistor value of a resistor. When the voltage applied to the second reference node N2 is higher than the pull-down reference voltage Vref_PD, the second comparator Comp2 may generate a down signal for decreasing the resistor value of the resistor.

The pull-down counter 3215 may output a first pull-down resistor code Ncal1_code in response to the second up/down signal. When the pull-down counter 3215 receives the up signal from the second comparator Comp2, the pull-down counter 3215 may increase the value of the first pull-down resistor code Ncal1_code. When the pull-down counter 3215 receives the down signal from the second comparator Comp2, the pull-down counter 3215 may decrease the value of the first pull-down resistor code Ncal1_code. In another embodiment, when the pull-down counter 3215 receives the up signal from the second comparator Comp2, the pull-down counter 3215 may decrease the value of the first pull-down resistor code Ncal1_code. When the pull-down counter 3215 receives the down signal from the second comparator Comp2, the pull-down counter 3215 may increase the value of the first pull-down resistor code Ncal1_code.

The second resistor code output circuit 322 may include a register 3224 and a second pull-up code generator 322a.

The register 3224 may store the first pull-up resistor code Pcal1_code received from the first resistor code output circuit 321.

The second pull-up code generator 322a may include a third pull-up resistor 3221, a second pull-down resistor 3222, a third comparator Comp3, and a pull-up counter 3223.

The third pull-up resistor 3221 may be coupled between the power voltage node and a third reference node N3, and have a resistor value controlled according to a second pull-up resistor code Pcal2_code.

The second pull-down resistor 3222 may be coupled between the third reference node N3 and the ground voltage node.

The third comparator Comp3 may generate a third up/down signal, based on a result obtained by comparing a voltage applied to the third reference node N3 and the target voltage Vtar. The pull-up counter 3223 may output the second pull-up resistor code Pcal2_code in response to the third up/down signal.

The third comparator Comp3 may be described like the first comparator Comp1 of the first pull-up code generator 321a. The pull-up counter 3223 may be described like the pull-up counter 3212 of the first pull-up code generator 321a.

In an embodiment, a size of the first pull-up resistor 3210 and the plurality of second pull-up resistors 3213 may be S1. A size of the first pull-down resistor 3214, the third pull-up resistor 3221, and the second pull-down resistor 3222 may be N times of S1. The size of a resistor may be in proportion to the width of a transistor included in the resistor. Therefore, when the size of the resistor is increased by N times, the resistor value of the resistor may be decreased to 1/N time.

In an embodiment, the first resistor code may include the first pull-up resistor code Pcal1_code and the first pull-down resistor code Ncal1_code. The second resistor code may include the second pull-up resistor code Pcal2_code. Since the second resistor code is generated through a calibration operation, based on the same resistor value as one lag resistor coupled to the DQ pad, the mismatch of the resistor value when the second resistor code is input to the DQ pad may be decreased, as compared with the first resistor code generated through the calibration operation, based on the external resistor value of the calibration circuit.

FIG. 10 is a flowchart illustrating an operation of the calibration circuit in accordance with an embodiment of the present disclosure. The calibration circuit may include a first resistor code output circuit and a second resistor code output circuit.

Referring to FIG. 10, in step S1001, the calibration circuit may perform a first calibration operation, based on a target voltage and a first resistor value. The first calibration operation may be an operation of generating a first resistor code such that the target voltage applied to a reference node has a set level, and correcting resistor values in the first resistor code output circuit through a feedback process, based on the first resistor code. The internal resistor values may be set based on a first resistor value. In an embodiment, the first resistor value may be a resistor value of an external resistor coupled to the calibration circuit.

In step S1003, the calibration circuit may output a first resistor code as a result obtained by performing the first calibration operation. The first resistor code may include a first pull-up resistor code and a first pull-down resistor code.

In step S1005, the calibration circuit may perform a second calibration operation, based on the target voltage, a second resistor value, and the first resistor code. The calibration circuit may set an initial resistor value of a pull-up resistor in the second resistor code output circuit, based on the first pull-up resistor code in the first resistor code. The calibration circuit may generate a resistor value of a pull-down resistor in the second resistor code output circuit, based on the first pull-down resistor code in the first resistor code.

The second calibration operation may be an operation of generating a second resistor code, based on a result of comparing a voltage applied between the internal pull-up resistor and the internal pull-down resistor with the target voltage, and correcting resistor values in the second resistor code output circuit through a feedback process, based on the second resistor code. The internal resistor values may be determined based on the second resistor value. In an embodiment, the second resistor value may be a resistor value of one lag resistor coupled to the DQ pad described with reference to FIG. 4. In an embodiment, the second resistor value may be different from the first resistor value. In an embodiment, the first resistor value may be an integer multiple of the second resistor value. Since the second resistor code is generated through the calibration operation, based on the same resistor value as one lag resistor coupled to the DQ pad, the mismatch of the resistor value when the second resistor code is input to the DQ pad may be decreased, as compared with the first resistor code generated through the calibration operation, based on the external resistor value of the calibration circuit.

In step S1007, the calibration circuit may output a second resistor code as a result obtained by performing the second calibration operation. The second resistor code may include a second pull-up resistor code.

In accordance with the present disclosure, there can be provided a calibration circuit having improved calibration performance and an operating method of the calibration circuit.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and speci-fication. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A calibration circuit comprising:
a first resistor code output circuit coupled to a first resistor through an input/output pad, the first resistor code output circuit configured to perform a first calibration operation, based on a first resistor value, such that a target voltage applied to a first reference node coupled to the input/output pad has a set voltage level, and output a first resistor code as a result obtained by performing the first calibration operation; and
a second resistor code output circuit configured to receive the target voltage, set an internal resistor value based on the first resistor code, perform a second calibration operation based on a second resistor value different from the first resistor value, and output a second resistor code as a result obtained by performing the second calibration operation,
wherein the first resistor value is a resistor value of the first resistor.

2. The calibration circuit of claim 1, wherein the first resistor code output circuit includes:
a reference voltage generator configured to generate a pull-up reference voltage and a pull-down reference voltage;
a first pull-up code generator configured to generate a first pull-up resistor code, based on the target voltage and the pull-up reference voltage; and
a first pull-down code generator configured to generate a first pull-down resistor code, based on the first pull-up resistor code and the pull-down reference voltage,
wherein the first resistor code includes the first pull-up resistor code and the first pull-down resistor code.

3. The calibration circuit of claim 2, wherein the first pull-up code generator includes:
a first pull-up resistor coupled between a power voltage node and the first reference node, the first pull-up resistor having a resistor value controlled according to the first pull-up resistor code;
a first comparator configured to generate a first up/down signal, based on a result obtained by comparing the target voltage and the pull-up reference voltage; and
a pull-up counter configured to output the first pull-up resistor code in response to the first up/down signal.

4. The calibration circuit of claim 3, wherein a resistor value of the first pull-up resistor is determined based on the first resistor value.

5. The calibration circuit of claim 2, wherein the first pull-down code generator includes:
a plurality of second pull-up resistors coupled between a power voltage node and a second reference node, the plurality of second pull-up resistors having a resistor value controlled according to the first pull-up resistor code;
a first pull-down resistor coupled between the second reference node and a ground voltage node;
a second comparator configured to generate a second up/down signal, based on a result obtained by comparing a voltage applied to the second reference node with the pull-down reference voltage; and a pull-down counter configured to output the first pull-down resistor code in response to the second up/down signal.

6. The calibration circuit of claim 5, wherein a number of the plurality of second pull-up resistors is N, where N is a natural number of 2 or more, and wherein a size of the first pull-down resistor is N times of that of the second pull-up resistor.

7. The calibration circuit of claim 5, wherein the resistor value of the first pull-down resistor is the same as an overall resistor value of the plurality of second pull-up resistors.

8. The calibration circuit of claim 5, wherein the plurality of second pull-up resistors are coupled in parallel.

9. The calibration circuit of claim 5, wherein a resistor value of each of the plurality of second pull-up resistors is determined based on the first resistor value, and a resistor value of the first pull-down resistor is determined based on the second resistor value.

10. The calibration circuit of claim 2, wherein the second resistor code output circuit includes:

a register configured to store the first pull-up resistor code received from the first resistor code output circuit; and a second pull-up code generator configured to generate a second pull-up resistor code, based on the first pull-down resistor code received from the first resistor code output circuit, the first pull-up resistor code received from the register, and the target voltage, and wherein the second resistor code includes the second pull-up resistor code.

11. The calibration circuit of claim 10, wherein the second pull-up code generator includes:

a third pull-up resistor coupled between a power voltage node and a third reference node, the third pull-up resistor having a resistor value controlled according to the second pull-up resistor code;

a second pull-down resistor coupled between the third reference node and a ground voltage node;

a third comparator configured to generate a third up/down signal, based on a result obtained by comparing a voltage applied to the third reference node with the target voltage; and a pull-up counter configured to output the second pull-up resistor code in response to the third up/down signal.

12. The calibration circuit of claim 11, wherein the resistor value of the third pull-up resistor and a resistor value of the second pull-down resistor are determined based on the second resistor value.

13. The calibration circuit of claim 1, wherein the second resistor value is set as a resistor value obtained by dividing the first resistor value by an integer multiple.

14. A method for operating a calibration circuit coupled to a first resistor through an input/output pad, the method comprising:

performing a first calibration operation, based on a first resistor value, such that a target voltage applied to a first reference node coupled to the input/output pad has a set voltage level;

outputting a first resistor code as a result obtained by performing the first calibration operation;

performing a second calibration operation, based on the target voltage, a second resistor value different from the first resistor value, and the first resistor code; and outputting a second resistor code as a result obtained by performing the second calibration operation, wherein the first resistor value is a resistor value of the first resistor.

15. The method of claim 14, wherein the outputting of the first resistor code includes:

outputting a first pull-up resistor code, based on a result obtained by comparing the target voltage and a reference pull-up voltage; and outputting a first pull-down resistor code, based on the first pull-up resistor code and a reference pull-down voltage, and wherein the first resistor code includes the first pull-up resistor code and the first pull-down resistor code.

16. The method of claim 15, wherein the outputting of the first pull-down resistor code includes:

setting a resistor value of a plurality of pull-up resistors, based on the first pull-up resistor code;

setting a resistor value of a pull-down resistor, based on the first pull-down resistor code; and outputting the first pull-down resistor code, based on a result obtained by comparing a voltage applied between the pull-down resistor and the plurality of pull-up resistors with the reference pull-down voltage, and wherein the plurality of pull-up resistors and the pull-down resistor are coupled in series between a power voltage node and a ground voltage node.

17. The method of claim 16, wherein resistor value of each of the plurality of pull-up resistors is determined based on the first resistor value, and the resistor value of the pull-down resistor is determined based on the second resistor value.

18. The method of claim 16, wherein a number of the plurality of pull-up resistors is N, where N is a natural number of 2 or more, and wherein a size of the pull-down resistor is N times of that of each of the plurality of pull-up resistor.

19. The method of claim 15, wherein the outputting of the second resistor code includes:

setting a resistor value of a pull-up resistor and a pull-down resistor, based on a first resistor code; and outputting a second pull-up resistor code, based on a result obtained by comparing a voltage applied between the pull-down resistor and the pull-up resistor with the target voltage, wherein the pull-up resistor and the pull-down resistor are coupled in series between a power voltage node and a ground voltage node, and wherein the second resistor code includes the second pull-up resistor code.

20. The method of claim 14, wherein the second resistor value is set as a resistor value obtained by dividing the first resistor value by an integer multiple.

* * * * *